United States Patent [19]

Whiteside

[11] Patent Number: 5,198,700
[45] Date of Patent: Mar. 30, 1993

[54] DOUBLETPULSE GENERATOR

[75] Inventor: Frank A. Whiteside, Coppell, Tex.

[73] Assignee: Dallas Semiconductor Corp., Dallas, Tex.

[21] Appl. No.: 790,313

[22] Filed: Nov. 8, 1991

[51] Int. Cl.[5] .................................... H03K 5/00
[52] U.S. Cl. ...................................... 307/273; 328/57
[58] Field of Search ............... 307/260, 261, 265, 268, 307/272.1, 273, 475; 328/34, 57, 62

[56] References Cited

U.S. PATENT DOCUMENTS

| | | | |
|---|---|---|---|
| 3,673,559 | 6/1972 | Schwartz | 307/273 |
| 4,529,896 | 7/1985 | Grandguillot et al. | 328/57 |
| 4,615,039 | 9/1986 | Li et al. | 328/57 |

Primary Examiner—Robert J. Pascal
Attorney, Agent, or Firm—Worsham, Forsythe, Samples & Wooldridge

[57] ABSTRACT

An interface for current mode to Manchester encoded serial signals includes symmetric positive/negative doublet pulse generation. The doublet pulse generator provides a pulse duration held constant by feedback and a voltage/current reference and a minimal gap between the positive and negative polarity pulses by using the same signal to both turn off the positive pulse driver and turn on the negative pulse driver. Fault detection by sensing of asymmetry in received pulse uses a comparator with both high and low threshold input devices to provide minor asymmetry tolerance.

3 Claims, 14 Drawing Sheets

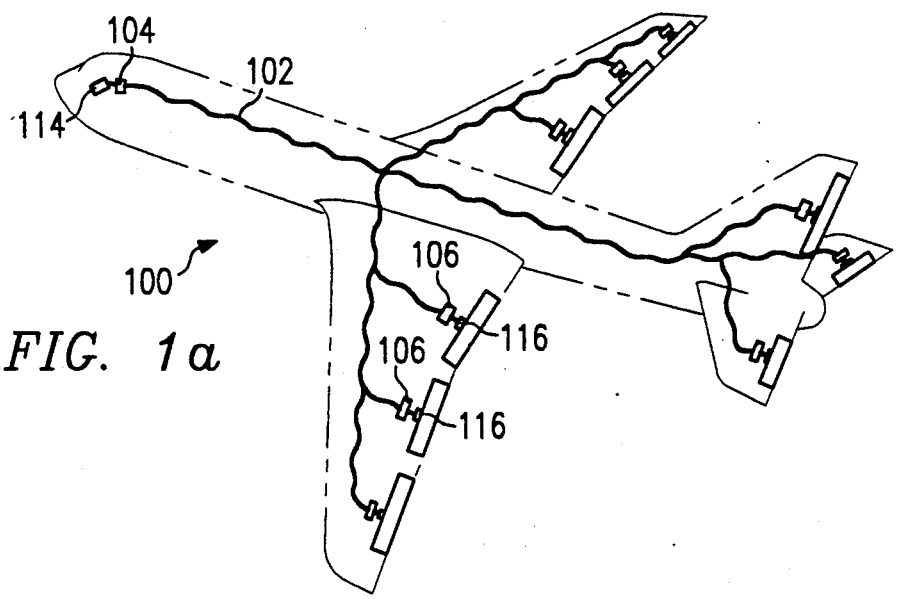
FIG. 1a
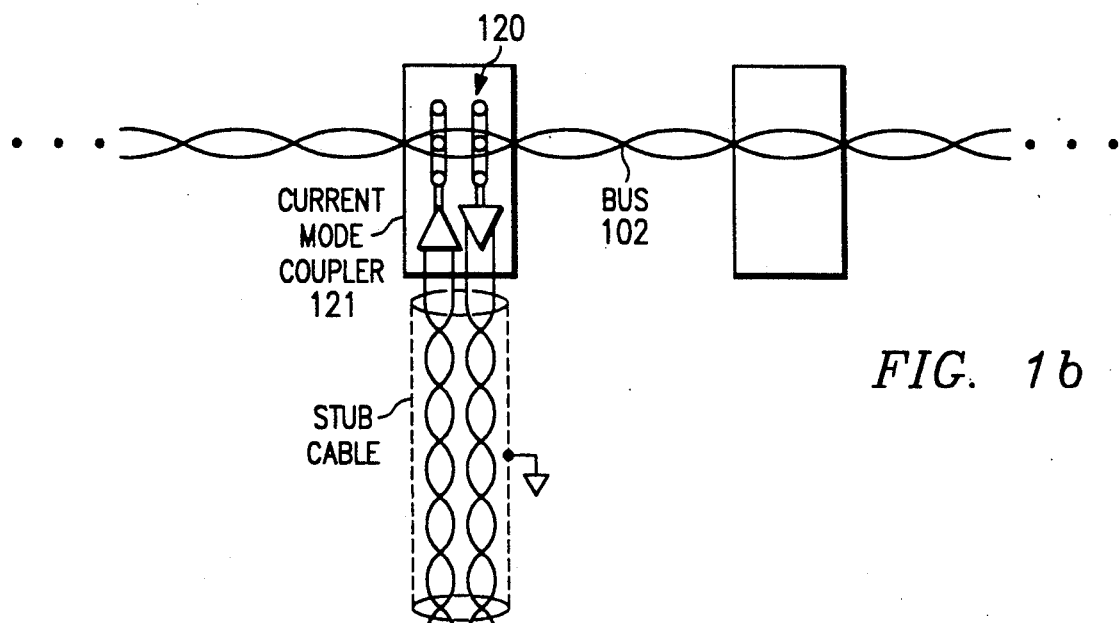
FIG. 1b
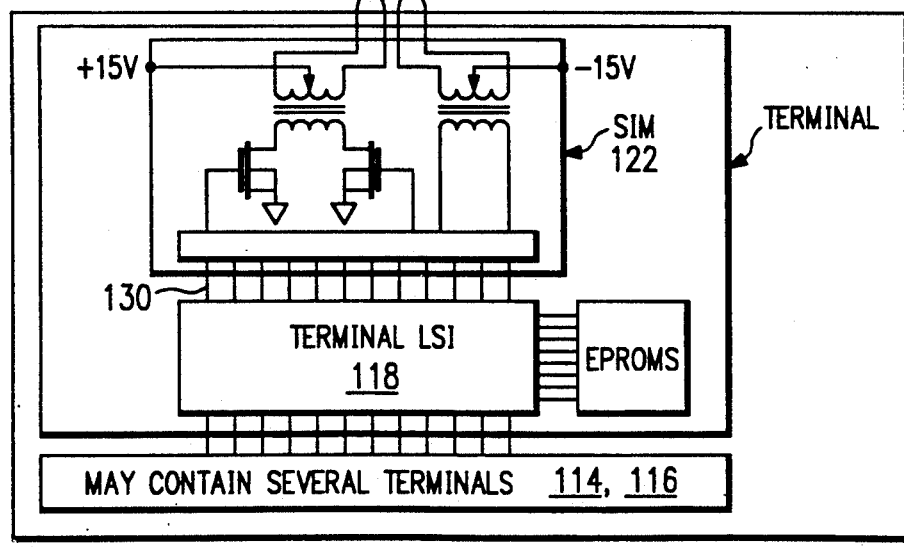

DOUBLETPULSE GENERATOR

BACKGROUND AND SUMMARY OF THE INVENTIONS

The present invention relates to electronic devices, and, more particularly, to semiconductor devices useful in communications.

Communications aboard an airplane for pilot control of wing flaps, tail flaps, engine power, and so forth were originally by cables running from the cockpit to the various controlled devices. Reliability and complexity of control communications led to the substitution of hydraulic systems for the cable systems, and then the substitution of electrical systems for hydraulic systems. Such electrical systems are constrained by requirements of high reliability and small available space. Multiple backups and noise tolerance help reliability, and balanced differential signals provide maximal noise immunity. Early electrical systems such as ARINC-429 use direct point-to-point wiring. Later systems such as MIL-1553 use a multiplexed serial data bus with Manchester coding to save weight by sharing a common bus cable. The still more recent ARINC-629 standard uses magnetic coupling into a bus cable without piercing the insulation of the cable; this gives higher reliability at the expense of more complex coding. Thus airplane control communication systems need efficient conversion between the usual Manchester encoded serial information and ARINC-629 protocol serial information.

Problems of conversion between Manchester and ARINC-629 signals include the generation of pairs of pulses (for the ARINC-629 doublets) of stable duration, with minimal delay between the input and the pulse pair output, and without the use of a crystal oscillator or system clock due to time delays or space limitations. Also, to increase reliability, the differential receivers need fault detection capability. This includes both the checking of an incoming signal for proper waveshape and the self-diagnosis of faults in he receiver circuitry.

Abidi, 22 IEEE J.Sol.St.Cir. 494 (1987) describes a switched capacitor feedback loop to linearize a voltage controlled oscillator. Wakayama and Abidi, 1987 IEEE Int.Sol.St.Cir.Conf. 220 (1987) describe a voltage controlled oscillator with a frequency to voltage servo loop to linearize the oscillator.

Liu and Meyer, 1988 IEEE Int.Sol.St.Cir.Conf. 22 (1988) use a frequency to voltage converter to linearize a voltage controlled oscillator and include a master slave arrangement to calibrate the oscillator frequency by locking to a crystal reference frequency.

Ware et al, 24 IEEE J.Sol.St.Cir. 1560 (1989) describe a reference voltage and a reference current generated from the same bandgap circuit so the references track and errors cancel.

The present invention provides pulse pair generation with stabilized pulse widths plus abutting opposite polarity portions without reliance on crystal oscillators or clock synchronization plus also provides fault detection within the paired transmission wiring.

BRIEF DESCRIPTION OF THE DRAWINGS

The present invention will be described with reference to the accompanying drawings, which are schematic for clarity:

FIGS. 1a–c show an application and overall block structure of a first preferred embodiment serial interface module;

DESCRIPTION OF THE PREFERRED EMBODIMENTS

Figure 1C:
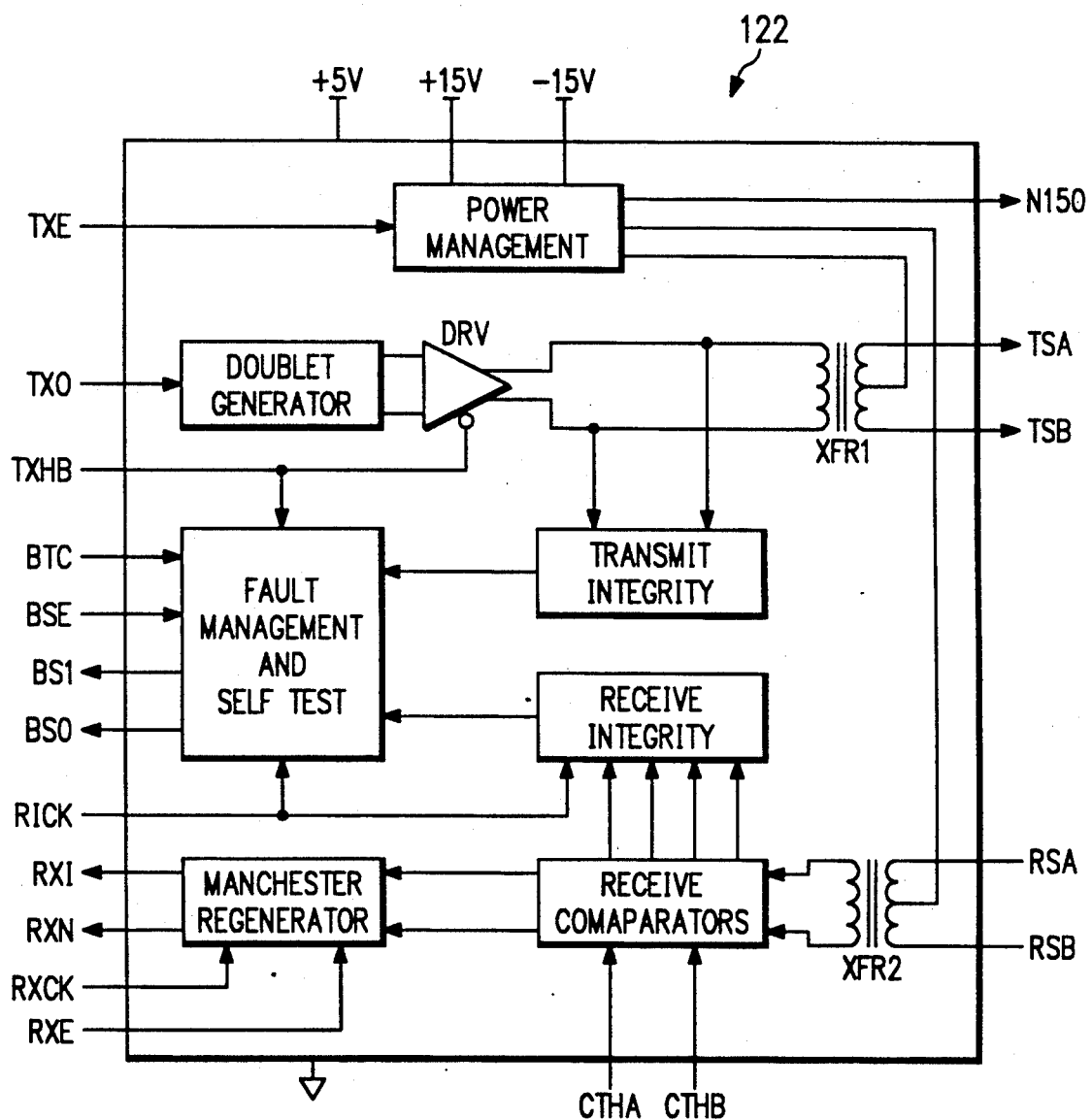

FIG. 1a is a schematic view of an airplane illustrating various communications involved with its operation. In particular, twisted wire bus 102 traverse the airplane 100 and magnetically couples to interfaces 104 and 106 which then connect by usual Manchester encoded serial wire to cockpit control and indicator devices 114 and remote servos, sensors and other devices 116. Of course, multiple and backup busses would be used, and on the order of thirty remote devices would be communicating with on the order of one hundred cockpit devices.

FIG. 1b shows first preferred embodiment serial interface module (SIM) 122 connected with current mode coupler 121 and inductive pickup 120 between twisted pair bus 102 and Manchester TTL interface 130 connecting through terminal LSI protocol device 118 to the cockpit devices 114 or remote devices 116.

FIG. 1c is a schematic block diagram of module 122 which includes blocks POWER MANAGEMENT for supplying DC power for operation of the current mode coupler, DOUBLET GENERATOR for generating symmetrical pulses with stabilized duration, DRV for driving the output lines, FAULT MANAGEMENT & SELF TEST for diagnosing faults and issuing a warning signal and/or attempting to repair the fault, TRANSMIT INTEGRITY and RECEIVE INTEGRITY for detection of faults and assessment of where the fault occurred, MANCHESTER REGENERATOR for generating Manchester format signals from the signals received from the bus, RECEIVE COMPARATORS for detection of incoming pulses and converting them from analog to digital levels, and transformers XFR1 and XFR2.

Figure 2:
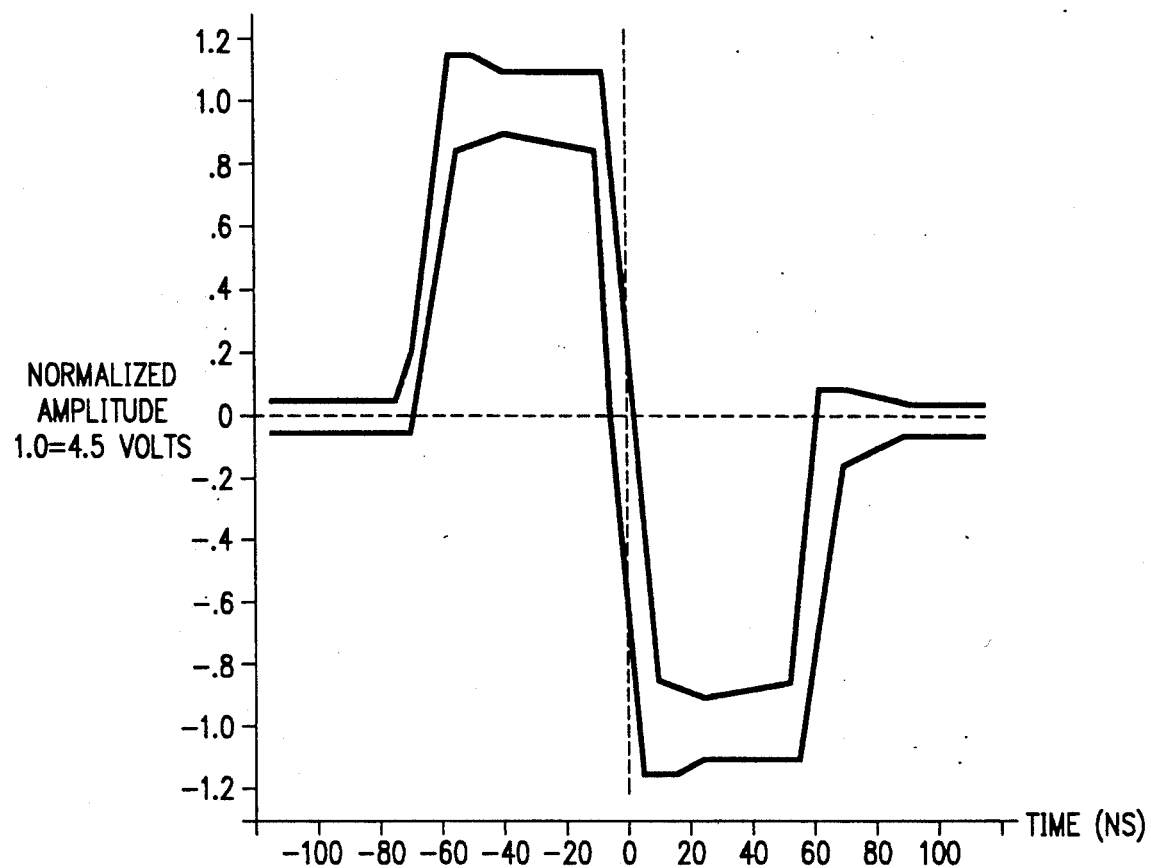
FIG. 2 is a waveform template.

The serial interface module 122 may be packaged as a small sealed device which performs code translation and signal conditioning for ARINC 629 current mode serial data systems. It is intended for use with a current mode coupler (CMC) in order to interface an ARINC 629 terminal to a current mode twisted pair bus; see FIG. 1b. The module 122 takes Manchester-encoded serial data from the terminal, and converts each data transition into a "doublet" consisting of a balanced differential pair of positive and negative pulses; see FIG. 2 for the doublet template. These pulses are short (62.5 nsec) to avoid saturation of the magnetic cores in the CMC. The module 122 demodulates the returning pulses from the CMC receiver and converts them back into Manchester format while performing various error checks. Both code conversions are performed asynchronously to minimize wraparound delay time. In addition, the module 122 performs various fault management, status reporting, and power conditioning functions. In particular, the following list of FIG. 1c terminals indicates their functions.

| TER-MINAL | TYPE | DESCRIPTION |
|---|---|---|
| TSA | OUT | Transmit Stub A; |
| TSB | OUT | Transmit Stub B. Outputs doublet pulses to CMC on 100 ohm stub cable; sends DC power to coupler. Contains internal 100 ohm termination resistor. |
| RSA | IN | Receive Stub A; |
| RSB | IN | Receive Stub B. Receiver input from CMC. Contains internal 100 ohm termination resistor, and transformer coupling to reject common mode noise. Sends DC power to coupler. |
| N15O | OUT | Negative 15 Out. Conditioned version of −15 v supply, for use in receive-only terminals where the coupler transmit stub wires are connected to N15O and the TXE input is grounded. |
| TXO | IN | "Transmitter Output" (from terminal to module 122). Each TTL logic transition on this input pin triggers the doublet generator circuits. |
| TXHB | IN | Transmit Inhibit. When high, this pin prevents the doublet generator circuits in the module 122 from driving any signal onto the transmit stub, and disables wraparound transmit monitor. |
| TXE | IN | Transmitter Enable. When high, this signal allows power to be sent to the coupler transmitter. When low, it inhibits the transmit stub similar to TXHB. The rising edge of TXE acts as a power-on reset. |
| RXI | OUT | Receiver "Inputs" (to terminal from module 122). These are the reconstructed Manchester-coded data received from the ARINC 629 bus. Tri-state outputs. |
| RICK | IN | Receive clock. System receive clock, runs at 16X the data rate, normally 32 MHz. |
| RXCK | IN | Receive data clock. Runs at 2X data rate, normally 4 MHz. |
| RXE | IN | Receive Enable. Active low, enables RXI, RXN output drivers. When high (inactive) and TXE is low (inactive), no power is sent to coupler. |
| CTHA | IN | Comparator Threshold A; |
| CTHB | IN | Comparator Threshold B. Internal pullups set receiver comparator thresholds to 700 millivolts; grounding both pins sets thresholds to 1000 mv. |
| BS1 | OUT | BITE Status 1; (BITE = Built-In Test) |
| BS0 | OUT | BITE Status 0. Report coupler test status (see infra). Tri-state outputs. |
| BTC | IN | BITE Command. Active low - requests execution of coupler test sequence. |
| BSE | IN | BITE Status Enable. Active low - enables BS0, BS1 outputs. |
| GND | GND | Connected to PCB ground |
| +5 V | PWR | Connected to a +5 V volt supply. |
| +15 v | PWR | +15 volts. |
| −15 v | PWR | −15 volts. |

The following table shows module 122 power consumption.

| | MILLIAMPS typ/max | | |
|---|---|---|---|
| Module 122 Activity | +15 v | −15 v | +5 v |
| Standby (RXE = 1, TXE = 0) | 7/12 | 0/0 | 10/15 |
| Quiescent (Bus Quiet) | 10/15 | 3/4 | 10/15 |
| Receiving | 10/15 | 3/4 | 15/20 |
| Transmitting + Monitor | 15/20 | 3/4 | 60*/80* |

* = Some of this power is delivered to the transmit stub, not dissipated.

If the relative duty factors for each mode are known, the expected power consumption can be computed from this table by linear interpolation.

Note that the module 122 also supplies DC power to the coupler, whose power usage is not shown here. The internal resistances of the module 122 will cause some additional power dissipation when feeding the coupler. Also note that "transmitting" always includes wraparound receive monitoring.

The module 122 is a hybrid module containing both analog and digital monolithic IC technology and various discrete components. It is packaged in a hermetically sealed ceramic enclosure 1.45"×0.6"×0.27". It has 28 pins arranged in a 0.600" spaced dual inline arrangement on 0.100" centers. The module 122 operates over the temperature range of −55° C. to +125° C.

The stub interface signals are balanced differential signals for maximum noise immunity, and are transformer coupled for common mode noise rejection. The module 122 has been designed to tolerate EMI events including lightning strikes to the airframe and HIRF fields. A noise threshold programming feature is available for operation at reduced sensitivity in exceptionally high noise environments.

Module 122 is designed to operate at a data rate of 2 million bits per second. However, because of the asynchronous nature of the transmitter, slower data rates (and clock speeds) can be used if necessary. Typically the data rate would be reduced to accommodate longer cabling delays, as reducing it will have little effect on noise immunity.

Module 122 may be divided into four basic functional blocks: the transmitter, receiver, fault management, and power conditioning sections.

TRANSMITTER OPERATION

Figure 3A:
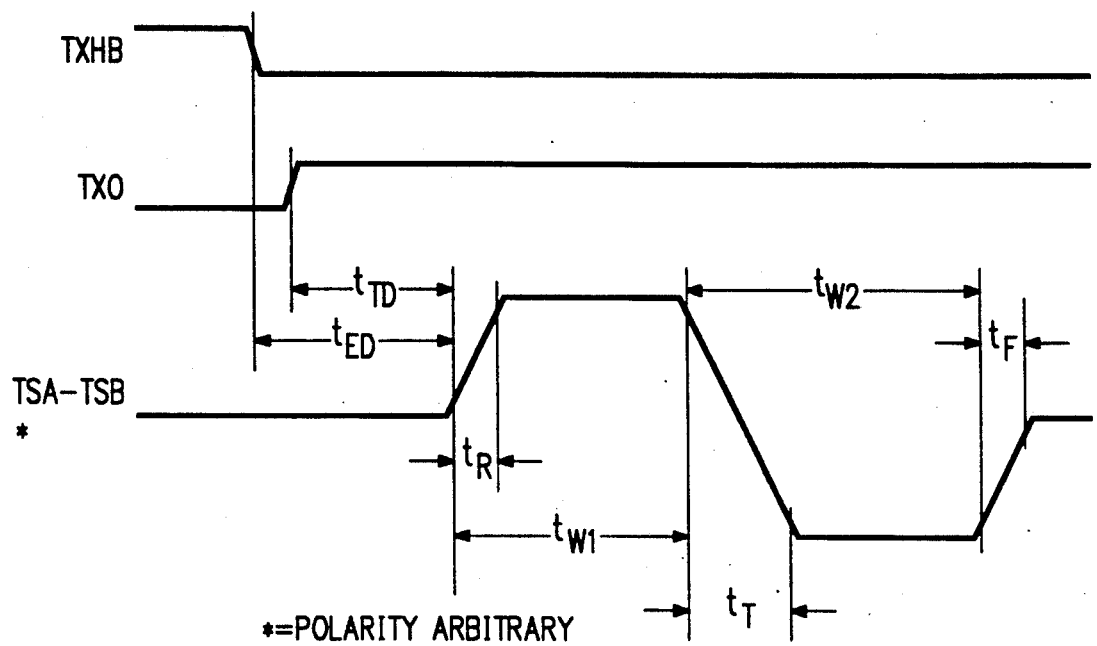
FIGS. 3a–b, 4, and 5 are timing diagrams.

To obtain a minimum wraparound delay time, the doublet generator circuits operate asynchronously. A transition on the TXO pin triggers the doublet pulse generator circuits, which produce a 62 nanosecond pulse followed immediately by a second 62 nsec pulse of opposite phase; see FIG. 3A. The differential amplitude of each pulse is 4.5 volts, +/−10%, as measured at the TSA/TSB pins with a 100 ohm load. Note that when the Manchester signal is converted into doublets its polarity is lost, and only the edge locations remain. The ARINC 629 protocol comprehends this.

The propagation delays from TXO and TXHB to the outputs TSA and TSB have been kept as small as possible (typically 10 nsec). In order to do this, TXHB functions as an output enable (when low) rather than enabling the internal doublet timing circuits. This prevents an unwanted doublet from being generated at the end of a wordstring if there is any skew between TXO and TXHB; see FIG. 4.

Enabling the transmitter output also requires one other condition. The power switching circuits must be sending the proper power polarity (described later) to the coupler, which requires TXE=1 and the absence of certain fault conditions.

RECEIVER OPERATION

Figure 3B:
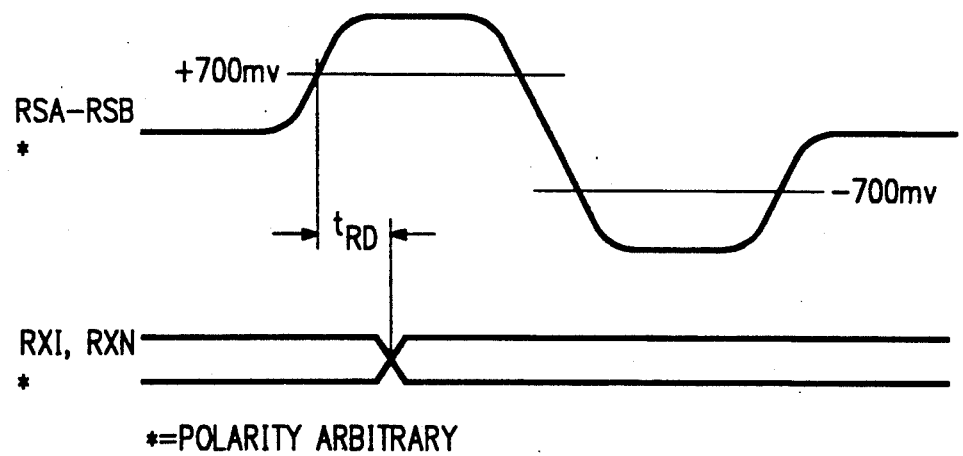

The input terminals RSA and RSB pass through an isolation transformer and into a series of differential comparators. The main pair of comparators normally have thresholds of +700 and −700 millivolts; see FIG. 3B. By grounding the CTHA and CTHB pins the high-noise threshold of +/−1000 mv is selected instead. The use of redundant threshold select pins is for reliability reasons, and grounding only one of the pins is considered a fault condition and renders the module 122 transmitter inoperative. Note that the use of the higher noise threshold feature reduces the sensitivity of the module 122 receiver, and should only be used if the airframe manufacturer's system design specifies doing so.

The main comparators drive a demodulator which reconstructs the original waveform. As in the transmitter, these circuits are designed to minimize wraparound delay, and therefore operate asynchronously.

Figure 4:
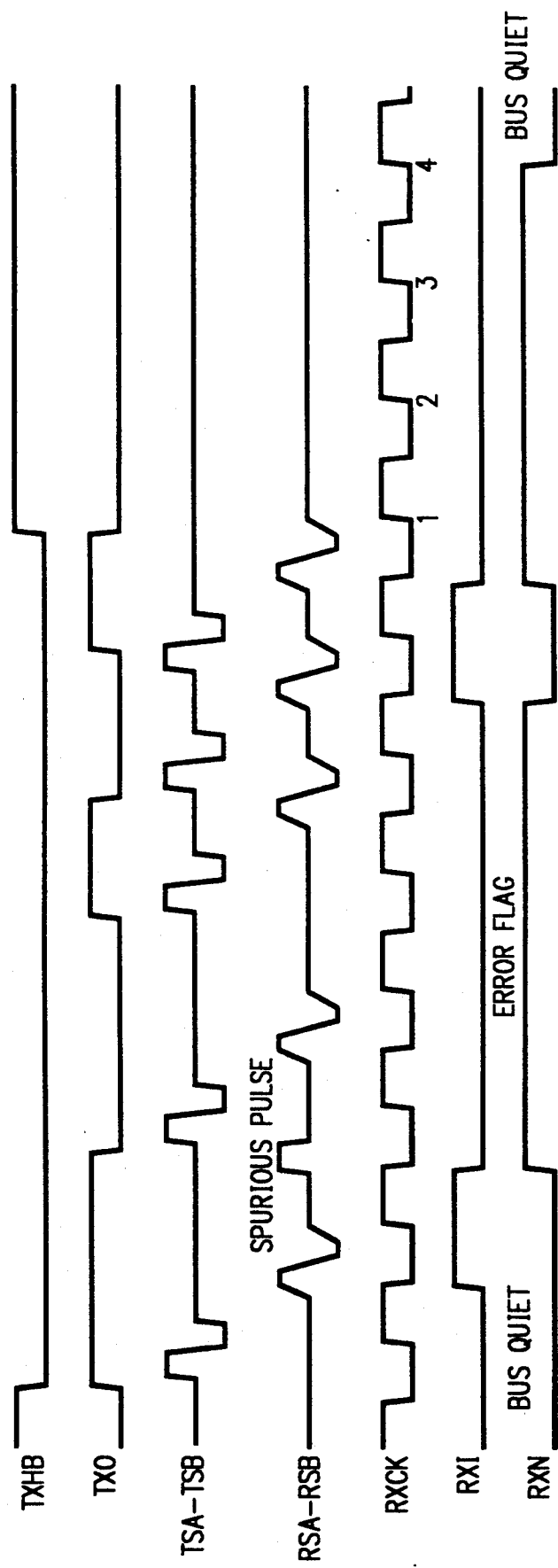

If the receiver inputs are quiet for four rising edges of the RXCK clock, a "bus quiet" condition is signalled by setting both the RXI and RXN outputs low; see FIG. 4. Upon reception of an input pulse, the RXI output is the first to transition high, provided the bus was quiet for at least three bit times (six rising edges of RXCK).

FAULT MANAGEMENT AND INTERNAL TEST FUNCTIONS

Module 122 constantly monitors its signal quality and reports any problems to the ARINC 629 terminal. This is done by monitoring the amplitude and symmetry on both the transmit and receive stub interfaces. If a problem is detected the module 122 signals this to the ARINC 629 terminal by preventing the next two transitions in the Manchester regenerating logic (a single deletion might not be noticed immediately in receive mode). The missing transitions will be detected by the checking logic in the terminal, which can truncate any transmission in progress to prevent a faulty message from being sent, or reject any message being received. FIG. 4 summarizes the transmitter and receiver operation and shows response to a spurious received pulse.

Module 122 is designed to work with a current mode coupler which may contain two separate channels for reliability. The module 122 selects which channel is used in the coupler by controlling the polarity of the doublets sent on the transmit stub. If an error is detected by wraparound checking in the module 122 during transmit, then at the beginning of the next wordstring the module 122 will order the coupler to switch to the opposite channel.

If the module 122 is unable to find a functioning coupler channel, it will enter a safety mode called "coupler fault" (COUF) mode. The module 122 and coupler transmitters are disabled until the TXE signal is cycled; see the following table.

| Logic Inputs | | | CTHA = CTHB? | Internal Status | | XMIT/RCV Enable | | Effect ON Reported Status |
|---|---|---|---|---|---|---|---|---|
| TXE | TXHB | RXE | | Coupler Fault | Power Fault | SIM Xmitter | Coupler Power | |
| 1 | 0 | X | YES | NO | NO | enabled | transceive | n/a |
| 1 | 1 | X | YES | NO | NO | disabled | transceive | n/a |
| 0 | X | 0 | X | NO | NO | disabled | receive | no test |
| 0 | X | 1 | X | NO | X | disabled | off | no test |
| X | X | 0 | NO | NO | NO | disabled | receive | no test |
| X | X | 1 | NO | NO | X | disabled | off | no test |
| X | X | 0 | X | YES | NO | disabled | receive | couf |
| X | X | 1 | X | YES | X | disabled | off | couf |
| X | X | X | X | NO | YES | disabled | off | no test |

The module 122 constantly monitors the wraparound path including itself and the selected coupler channel. In addition, a test function is available which selects and monitors the spare coupler channel, and then reports the status of both channels via the status pins BS0 and BS1 which are enabled by the BSE signal being low.

The status codes are given in the following table.

| CONTROL INPUTS | | STATUS OUTPUTS | | IMPLIED SYSTEM STATUS |
|---|---|---|---|---|
| BSE | BTC | BS1 | BS0 | |
| 0 | X | 0 | 0 | coupler fault (COUF) |
| 0 | 1 → 0 | 0 | 1 | 1 good coupler channel |
| 0 | 1 → 0 | 1 | 0 | 2 good coupler channels |
| 0 | 1 → 0 | 1 | 1 | module 122 fault or no test |
| 0 | (no edge) | 1 | 1 | no test |
| 1 | X | (high Z) | | no test |

Note that the coupler test sequence may take a terminal interval or more to execute, which can be tens of milliseconds, and until the test is complete the "no test" code is issued. This delay is because the test uses regular data transmissions, to avoid polluting the bus. The specific time required for the execution of a test sequence is as follows:

a. If transmission of a wordstring is in progress, the test will be delayed until the wordstring finishes.
b. The spare channel is tested during the next wordstring transmitted. This may being almost immediately (if BTC fails immediately before transmission of a new wordstring is begun) or as much as an aperiodic epoch, which can be several tens of milliseconds.
c. Test results become available after the end of the wordstring plus a delay of six cycles of RXCK to allow data to wrap around through cabling delays and be processed.

Figure 5:
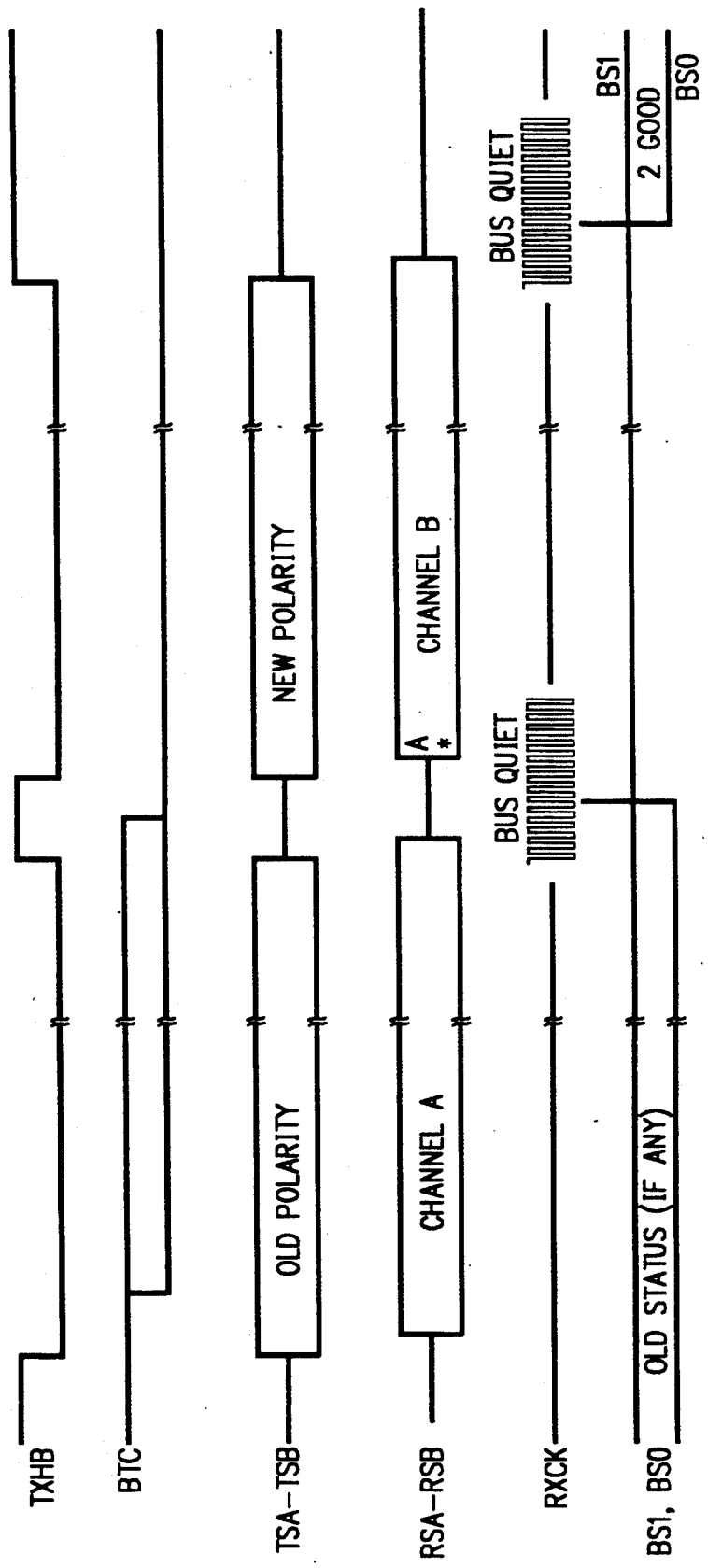

A "no test" status code on the BS0/BS1 outputs can mean that the test sequence is still in progress (just described), that the module 122 is defective (as determined by the transmit monitor), or that the module 122 transmitter is not operating due to some input signal (see table, supra) or a power fault trip (described later) disabling the module 122 transmitter. FIG. 5 illustrates test timing.

POWER CONDITIONING AND PROTECTION FUNCTIONS

Module 122 performs several power management functions:
1. Switching of coupler power supply (see table, supra):

When the coupler is fully enabled (by TXE=1 and no fault conditions), the +15 v supply is fed to TSA and TSB, and the −15 v supply is fed to RSA and RSB. The supplies are connected to the stub pairs via the center taps of the stub I/O transformers. When only the receive mode is enabled (by RXE=0 and either TXE=0 or a fault condition), the −15 v supply is fed to TSA and TSB, and the +15 v supply is fed to RSA and RSB.

2. Power fault isolation. The module 122 contains overcurrent detectors which are activated at approximately 800 milliamps, and if the overcurrent condition persists for 32 microseconds a power fault condition is entered. Similarly, an undervoltage detector causes a power fault condition to be entered if the +15 v supply feed to the stub cables drops below 8 volts for 32 microseconds. The power fault condition shuts off all power to the coupler and stub cables until an edge is detected on either TXE or RXE. In general, the rising edge of TXE is treated as a power or reset.

3. RF decoupling: All power supply connections are internally bypassed by ceramic capacitors in the module 122.

Power requirements: The +15 v and −15 v supplies should be bypassed by at least 10 microfarads each for best immunity to common mode noise pickup on the stub cables. Additional RF bypass capacitors are not necessary. The impedances on the +15 v and −15 v supplies should be similar to prevent common mode noise picked up on the stub cables from modulating the coupler transmit amplitude.

Special requirements for 15 volt supplies shared by multiple module 122s:

If more than one module 122 is operated from the same power supplies, it is recommended that the +/−15 volt power supplies be bypassed by at least 40 microfarads. This is to prevent a power fault downstream of one module 122 from dragging the shared power supplies below +/−10 volts before the overcurrent interrupter can act.

Also, the power supply must be able to supply sufficient current such that a gradual current runaway in a coupler will not cause the power supply to limit before module 122 does.

Note that module 122 does not contain provisions to block voltage surges the stub cables from travelling back into the shared +/−15 volt supplies. If these supplies are shared by multiple module 122s, they should be protected by appropriate means. If a stub cable experiences a large voltage surge (such as a short to +28 Vdc b or 100 Vac), large currents will be drawn by the protection device, which will cause a bondwire to open in the respective module 122 before any other module 122s or their couplers can be damaged.

Figure 6A:
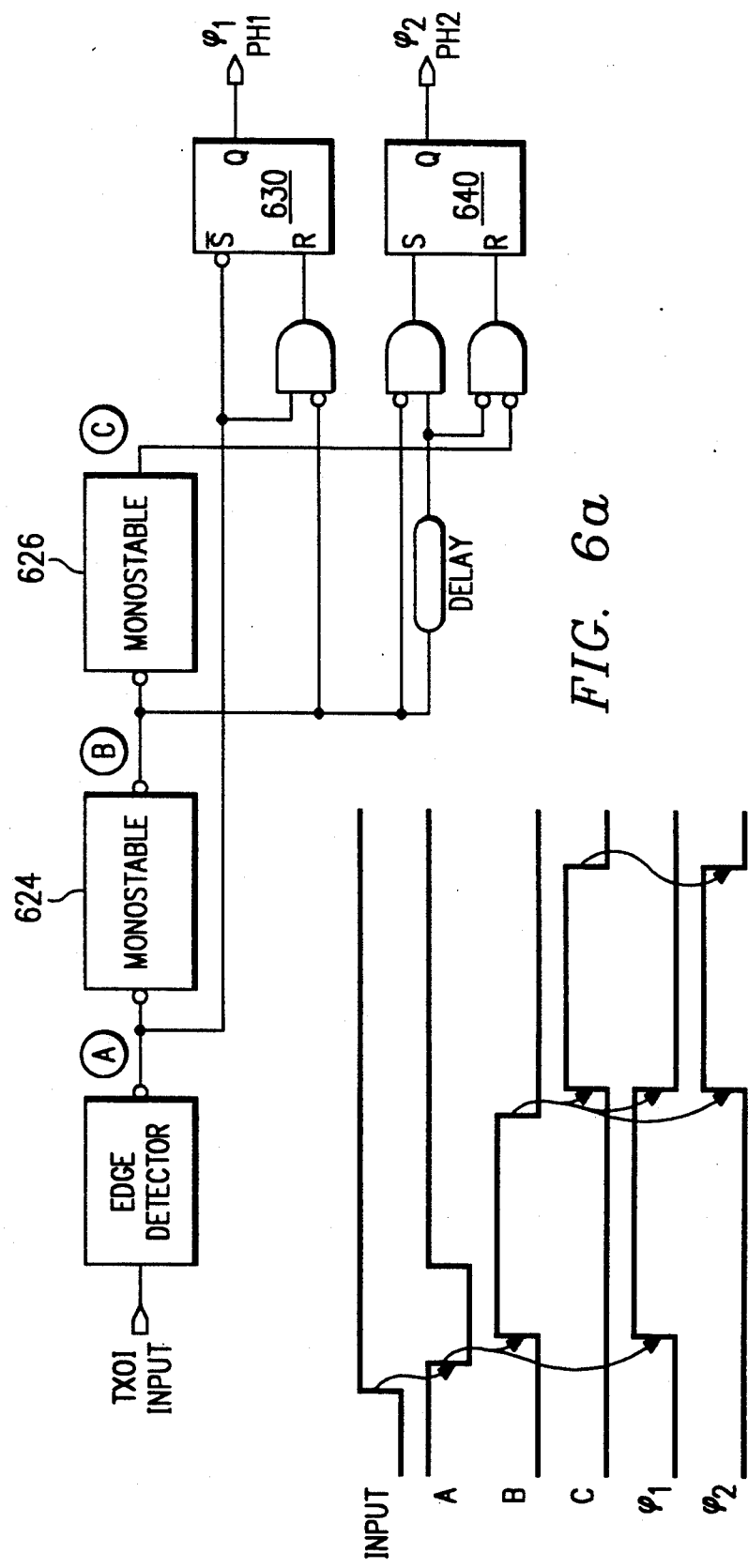
FIGS. 6a–b and 7 schematically illustrate a portion of the circuitry of the embodiment of FIG. 1c.
Figure 6B:
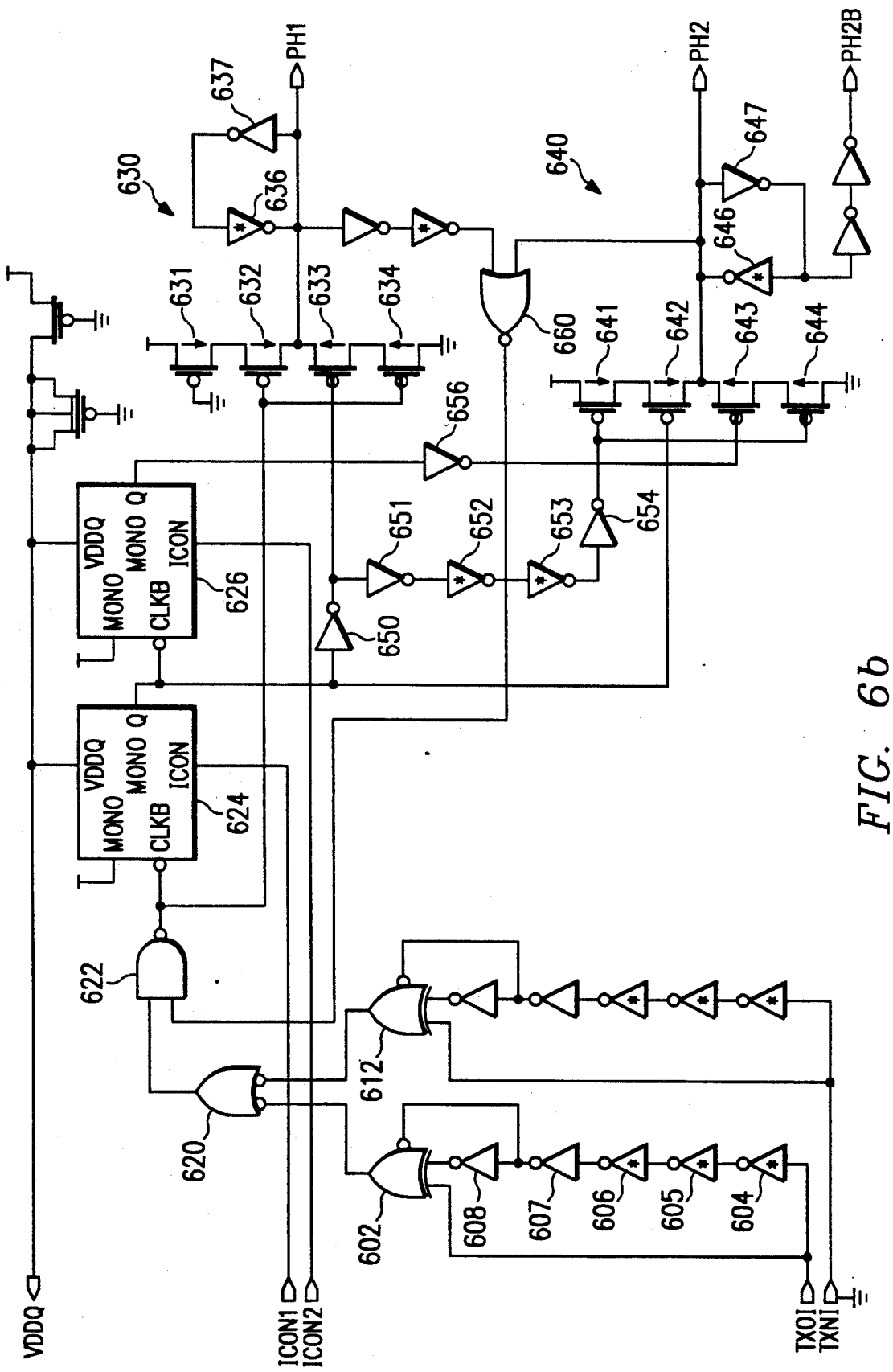
Figure 7:
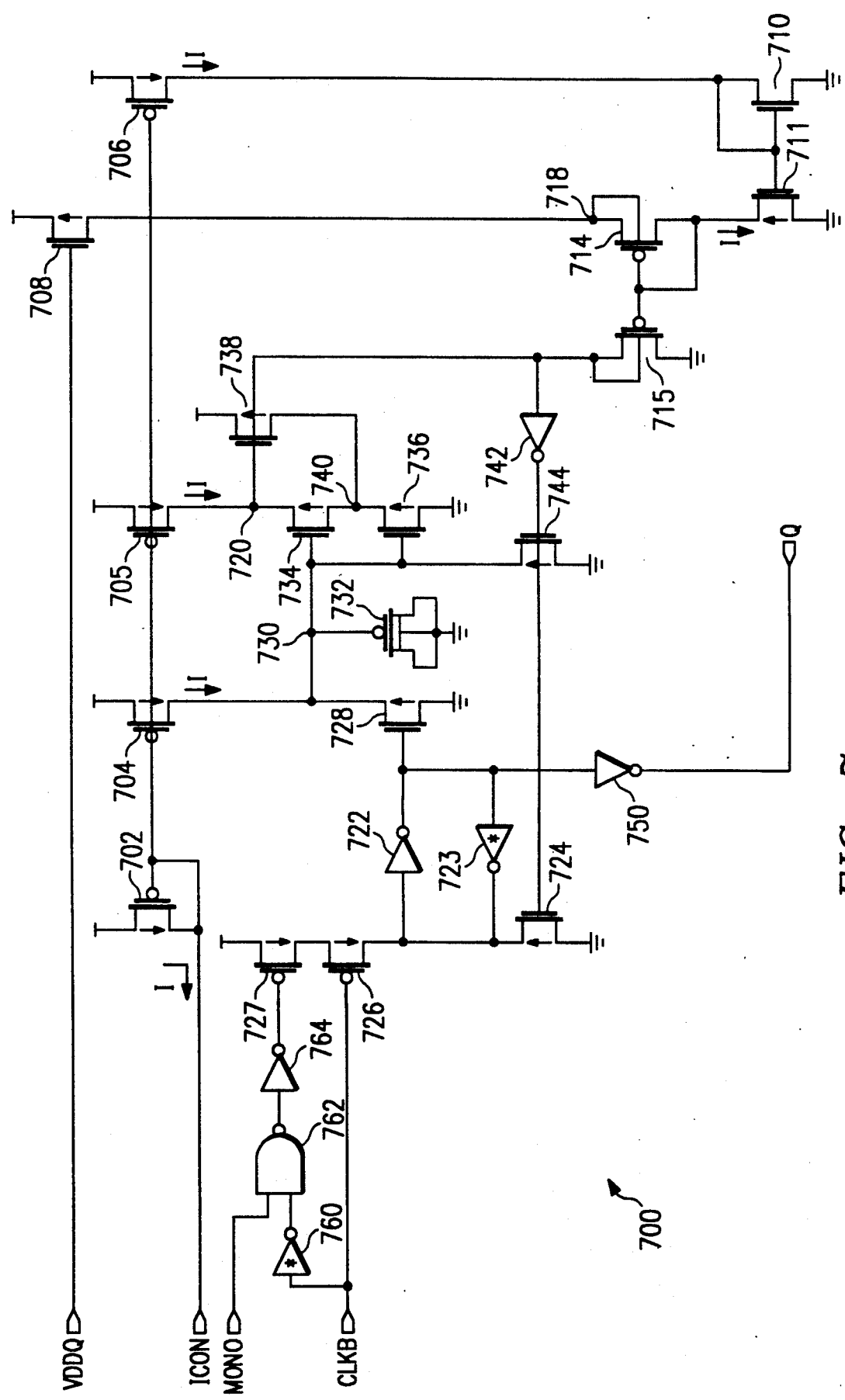
Figure 8:
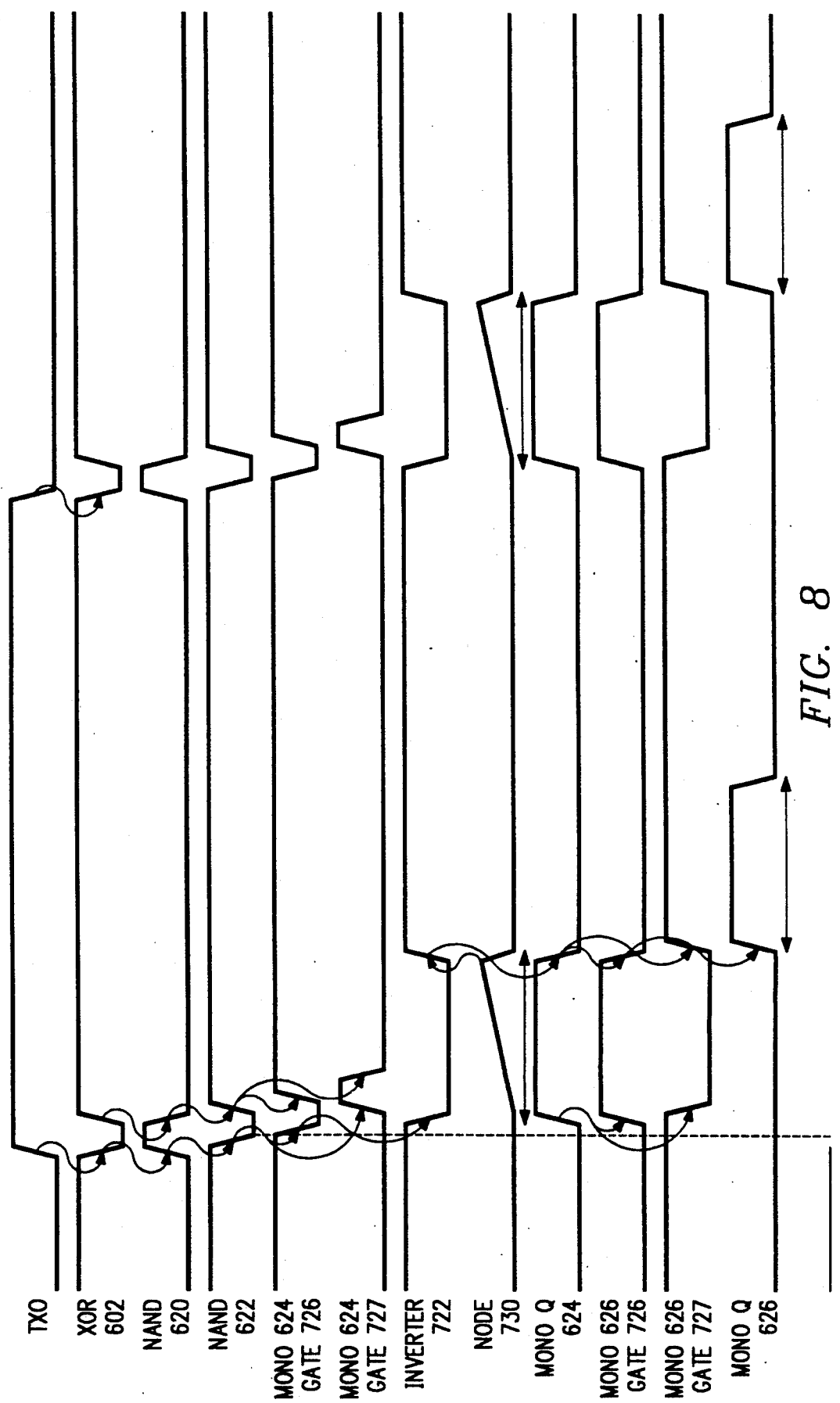
FIGS. 8–9 are timing diagrams for the circuitry of FIGS. 6a–b and 7.

FIGS. 6a-b are schematic diagrams of block DOUBLET GENERATOR of FIG. 1c with FIG. 6a showing simplified functional subblocks and FIG. 6b showing specific circuitry for implementation. FIG. 7 illustrates circuitry for the MONO/MONOSTABLE subblocks of FIGS. 6a-b. The timing diagrams of FIG. 8 illustrate the operation of DOUBLET GENERATOR as follows.

An input low to high transition (ground to +5 volts) at node TXOI (TXO in FIG. 1c) switches the output of Exclusive OR (XOR) gate 602 from high to low and then back to high. The duration of this low pulse from XOR gate 602 equals the propagation time through the five inverters 604–608 and is about 5 nsec. The node TXNI is held at ground so the output of XOR 612 remains high. Thus NAND gate 620 outputs a high pulse of duration 5 nsec to NAND gate 622. The other input of NAND gate 622 will be seen to be high at this time, so NAND gate 622 feeds a low pulse of duration 5 nsec to both the CLKB input of monostable circuit 624 and an input of flip-flop 630. The output of monostable 624 drives both the CLKB input of monostable 626 and inputs of flip-flops 630 and 640. Lastly, the output of monostable 626 also drives an input of flip-flop 640; and the flip-flops 630 and 640 generate the doublet signal at nodes PH1-PH2.

First, consider the operation of the monostable circuits: FIG. 7 is a schematic circuit diagram of monostable circuit 700 which is the same as monostable circuits 624 and 626 (and also monostable circuit 1100 of FIG. 11). The use of the same monostable circuitry for each of 624, 626, and 1100 permits the matching of components and thermal variations; this insures that the monostables 624, 626, and 1100 have substantially identical performance. The power supplies denoted by the Ts are typical CMOS level power at about 5 volts (VDD). Node ICON supplies a current regulator to ground to set the current I drawn by diode-connected p-channel FET 702, and this current I is mirrored by each p-channel FETs 704–706 which has the same gate width to length ratio as FET 702. VDDQ (a low noise version of VDD) turns n-channel FET 708 on as a source-follower and the gate to source drop for current I is approximately the threshold voltage $V_T$; then n-channel FETs 710–711 mirror the current I through diode-connected p-channel FET 714. P-channel FET 715 acts as a source-follower clamp, which prevents node 720 from becoming more positive than node 718. This controls the trip point of Schmitt trigger circuit 734–740, setting the trip point at approximately $(VDDQ-V_T)/2$. To see how node 720 varies, two cases are considered: (1) inverter 722 outputting a high and (2) inverter 722 outputting a low; note that inverters 722–723 form a feedback loop and that inverter 723 is made of FETs with small gate width to length ratios so the output of inverter 723 is easily overpowered by a turned on n-channel FET 724 or by turned on p-channel FETs 726–727.

For case (1) n-channel FET 728 is turned on and pulls node 730 low because the gate width to length of FET 728 is about six times that of FET 704 and the gate to source voltage is also greater for FET 728, so the 5 volt drop is primarily across FET 704. Node 730 low implies capacitor 732 is discharged and n-channel FETs 734 and 736 are turned off. Thus node 720 is close to VDD-$V_T$. Now node 720 close to high implies (i) n-channel FET 738 is turned on and node 740 between FETs 734 and 736 (which are turned off) rises to about a threshold below node 720 and also (ii) inverter 742 is low which turns off n-channel FETs 724 and 744. Monostable circuit 700 will remain in this state (outputting a low at node Q by inverter 750) until the feedback loop of inverters 722–723 is switched by both of FETs 726–727 being turned on.

Case (2) arises from case (1) by either nodes MONO and CLKB both low (as for monostable circuit 1100 in FIG. 11) or by node MONO high and node CLKB making a high to low transition (as for monostable circuits 624 and 626 of FIGS. 6a-b). In particular, the output of NAND gate 622 in FIG. 6b feeds the CLKB input of monostable 624 while the MONO input is held high. In this case the gate of FET 726 goes low for a time interval determined by the delay of inverters 604–608, whereas the gate of FET 727 goes high for the same time interval but starting at a time delayed by the propagation delay through inverter 760, NAND gate 762, and inverter 764 (about 5 nsec); see FIG. 8. Thus FETs 726 and 727 are simultaneously turned on for 5 nsec, and this is sufficient time to pull the input of inverter 722 high and switch the feedback loop 722–723 to a state of inverter 722 low (and the Q output high).

Once inverter 722 goes low, FET 728 turns off and the current I from FET 704 begins charging up capacitor 732 and the voltage on node 730 rises. When the voltage on node 730 reaches the threshold of FET 736, current begins flowing through FETs 738 and 736 and the voltage on node 740 starts dropping. In fact, FETs 736 and 738 have the same gate width to length ratio, and they form a simple inverter with input node 730, output node 740, load bias node 720, and gain of 1. Thus when the voltage on node 730 is rising and near $(VDD-V_T)/2$ volts, the voltage on node 740 rapidly changes from about two thresholds below high to close to low. And when node 740 goes low, then FET 734 turns on and the current from FET 705 is diverted away from FET 715 and passes through FETs 734 and 736 which have much greater gate width to length ratios than FET 715. This current diversion implies a drop in the voltage at node 720 which turns off FET 738 and accelerates the drop of node 720.

When node 720 goes low, inverter 742 switches from low to high and turns on FETs 724 and 744. FET 744 has a gate width to length ratio much greater than that of FET 704 and starts discharging capacitor 732 and will turn off FETs 734 and 736. Simultaneously, FET 724 pulls the input of inverter 722 low which turns on FET 728 and switches monostable circuit 700 back to the Q=0 state. The turning off of FETs 734 and 736 means that node 720 again goes high and inverter 742 switches back to low to turn off FETs 724 and 744 to isolate node 730 and feedback loop 722-723. Hence, monostable circuit 700 is back to the case (1) and waits for another high to low transition on node CLKB. That is, with input node MONO connected to high, monostable circuit 700 acts as a one-shot with pulse width determined by the capacitance of capacitor 732 and the current I from current source 704.

Applying the foregoing analysis of monostable circuit 700 to the monostables 624 and 626 yields the following operation of DOUBLET GENERATOR of FIG. 6b: As described above, a low to high Manchester signal on node TXOI passes through edge detector 602/604-608 and gates 620 and 622 (presuming that the feedback input to NAND gate 622 is high) and provides a low pulse at the CLKB input of monostable 624 which switches monostable 624 from the Q=0 state to the Q=1 state by driving the corresponding FETs 726-727 conducting for 5 nsec as previously described; see FIG. 8, first nine panels.

The Q output of monostable 624 feeds the CLKB input of monostable 626, so when monostable 624 returns to the Q=0 state after the 62 nsec capacitor 732 charge up and discharge, this transition switches monostable 626 from the Q=0 state to the Q=1 analogous to the prior switching of monostable 624. As with monostable 624, monostable 626 returns to the Q=0 state after a time interval of 62 nsec which is determined by the capacitor 732 and the current from source 704. See FIG. 8, last three panels. Note that due to the use of the same circuitry for monostables 624 and 626, the capacitance and currents will be matched as discussed in connection with FIGS. 10-11.

This switching of states of monostables 624 and 626 generates the output doublet as follows. Flip-flop 630 stores a state in the feedback loop made of inverters 636 and 637, and this state is output at node PH1. Similarly, flip-flop 640 stores a state in feedback loop 646-647 and outputs it at node PH2. Note that inverters 636 and 646 have small gate width to length ratios, so the outputs of FETs 631-634 and 641-646 can easily switch the states. The gate of p-channel FET 631 is tied low, so FET 631 is always on. The gates of FETs 632 (p-channel) and 634 (n-channel) are driven by the output of NAND 622 (which also drives CLKB of monostable 626) so prior to a Manchester signal edge at input TXOI, FET 632 is off and FET 634 is on. The Q output of monostable 624 drives the gate of n-channel FET 633 through inverter 650, so FET 633 is initially on. Thus both n-channel FETs 633-634 are initially on and pull inverter 636 low and put inverter 637 high to output a low at node PH1. Similarly, the Q output of monostable 624 drives p-channel FET 642 and also p-channel FET 641 but after five inversions by inverters 650-654. Thus FET 642 is initially on, but FET 641 is initially off. The five-times inverted Q output of monostable 624 also drives n-channel FET 644, which is thus initially on; and the Q output of monostable 626 drives, after inversion by 656, n-channel FET 643, which is thus also initially on. Hence, both n-channel FETs 643-644 are initially on, and this pulls inverter 646 low and puts inverter 647 high together with output node PH2 low. Note that the two lows at nodes PH1 and PH2 make NOR gate 660 high and verifies the earlier presumption that this input to NAND gate 622 was initially high.

Figure 9:
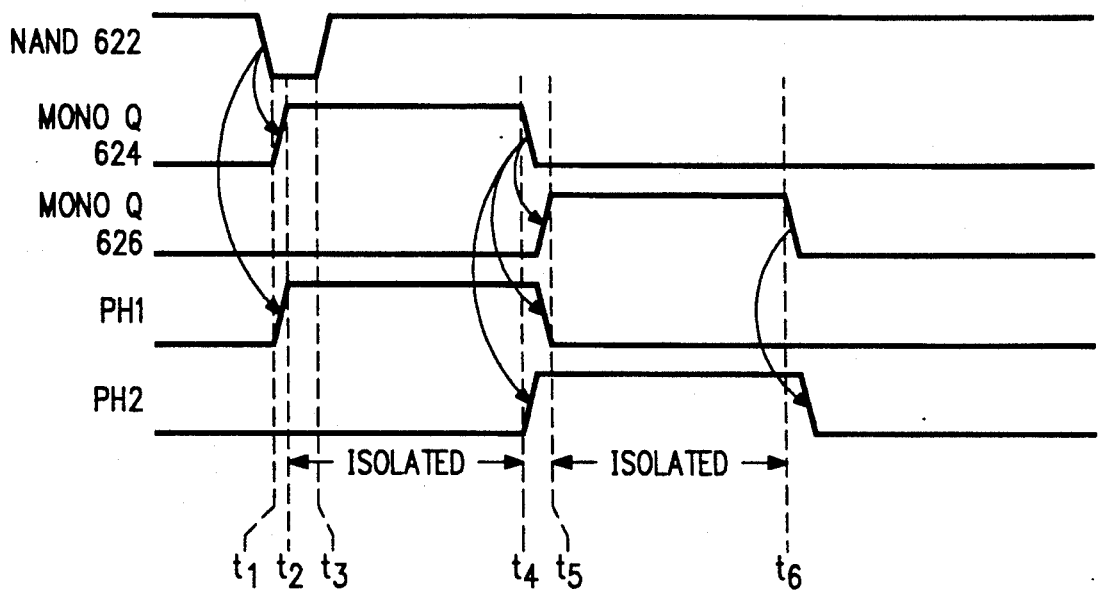

FIG. 9 illustrates the timing in the switching of nodes PH1 and PH2. An input low pulse at time $t_1$ from NAND gate 622 turns on pull up FET 632 and turns off pull down FET 634, thus inverter 636 is pulled high and inverter 637 driven low to switch the feedback loop 636-637 and drive node PH1 high. Next, at time $t_2$ when monostable goes to Q=1, pull down FET 633 is also turned off, pull up FET 642 is turned off, and after the delay of inverters 650-654, pull up FET 641 is turned on and pull down FET 644 is turned off. Due to the delay of inverters 650-654, at least one of pull up FETs 641 and 642 is off, so feedback loop 646-647 is not affected but is isolated and holds its low state because pull down FET 644 is now off. Now at time $t_3$ when the input pulse from NAND gate 622 ends and gate 622 returns high, which turns off pull up FET 632 and turn on pull down FET 634, monostable 624 already has Q high and this holds pull down FET 633 off so that feedback loop 636-637 is not affected but is isolated and holds its PH1 high state. Thus both nodes PH1 and PH2 are isolated until time $t_4$ when monostable 624 switches back to Q=0. This turns on pull down FET 633 (after the minimal delay of inverter 650) and simultaneously turns on pull up FET 642. Thus feedback loop 636-637 is switched to low and feedback loop 646-647 is switched to high. At time $t_5$ monostable 626 has Q going high to turn off pull down 644, and this occurs prior to the transition of monostable 624 from Q=1 to Q=0 has propagated through delay inverters 651-654. Thus at least one of pull down FETs 643 and 644 is off. After the delay from inverters 651-654, pull up FET 641 turns off, and feedback loop 646-647 is isolated and remains in the PH2 high state.

Note that the duration of the time intervals that PH1 and PH2 are high are identical and that there is no gap between the falling of PH1 and the rising of PH2. In particular, PH1 going high occurs by the falling edge of the signal into CLKB of monostable 624 also turning on pull up FET 632, and PH2 going high occurs by the falling edge of the signal into CLKB of monostable 626 also turning on pull up FET 642. The duration of monostable 624 in Q=1 after the falling edge into its CLKB is the same as the duration of monostable 626 in Q=1 after the falling edge into its CLKB because the circuitry is matched and the current sources are also matched, as described below. PH1 goes low when the falling edge of Q from monostable 624 is inverted by inverter 650 and then turns on pull down FET 633; and PH2 goes low when the falling edge of Q from monostable 626 is inverted by inverter 656 and turns on pull down FET 644. Lastly, the falling edge of Q from monostable 624 is both the pull down of PH1 and the pull up of PH2, except for the delay of inverter 650, and this minimal delay (1 nsec) actually makes the pull down of PH1 start just after PH2 begins to rise and avoids the gap where both of PH1 and PH2 are below maximum.

Lastly, when the Manchester signal input at TXOI returns from high to low, the edge detector 602/604-608 again generates a low going pulse which first switches monostable 624 into Q=1 for 5 nsec and then this switches monostable 626 into Q=1 also for 5 nsec; see the righthand portion of FIG. 8. Thus the DOUBLET GENERATOR generates the PH1 and PH2 pulses with little delay from the incoming TXOI signal and with no gap between the pulses which will yield a doublet without a middle flat spot. Also, the PH1 and PH2 pulses are of the same duration (even with changing temperature and over time as discussed in connection with FIGS. 10-11 below) so the resulting doublet will be symmetrical and of constant shape despite temperature variations and drift over time. And these properties are achieved without the use of a crystal oscillator or a synchronizing clock (which would inject a synchronization delay).

Figure 10:
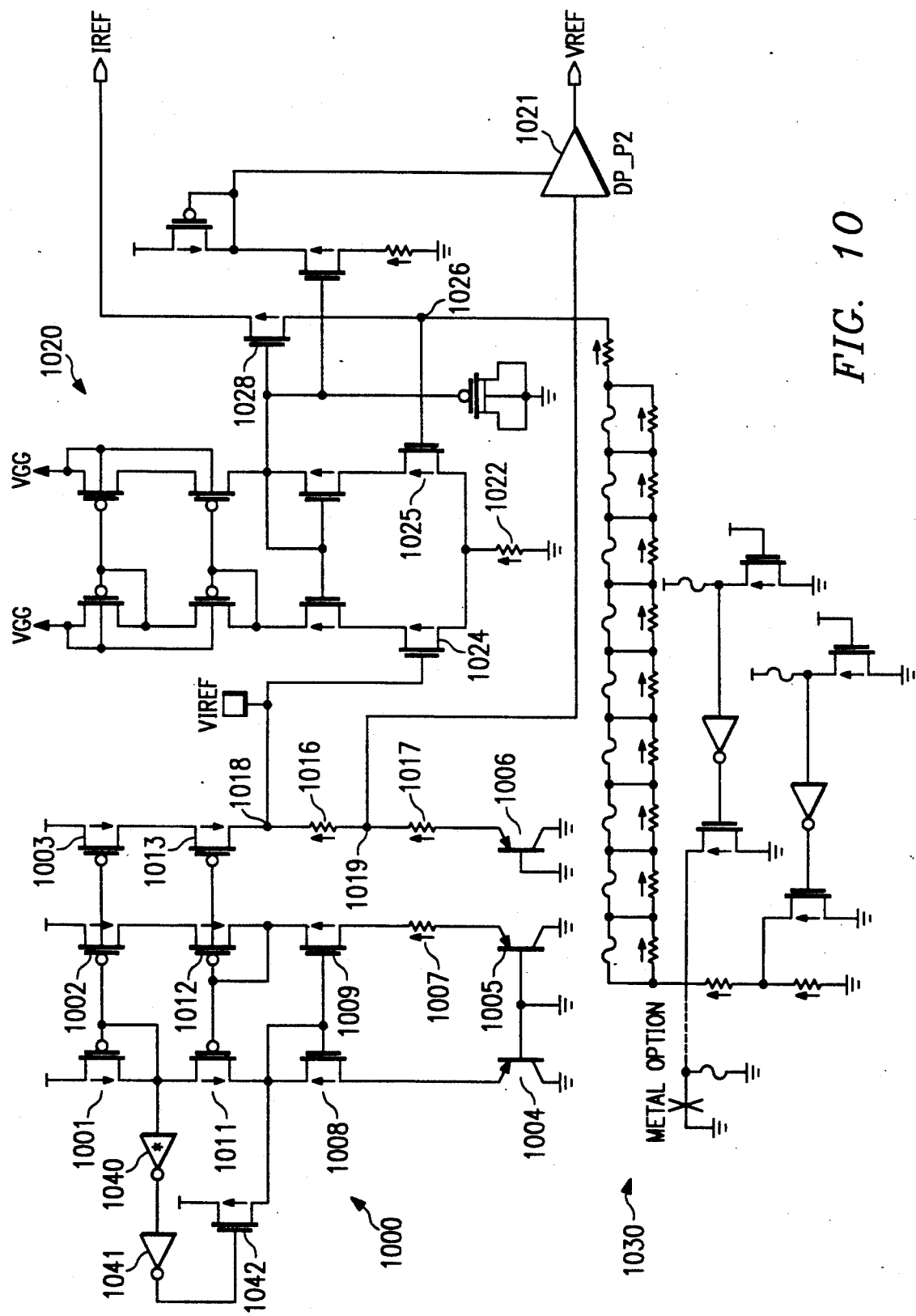
Figure 11:
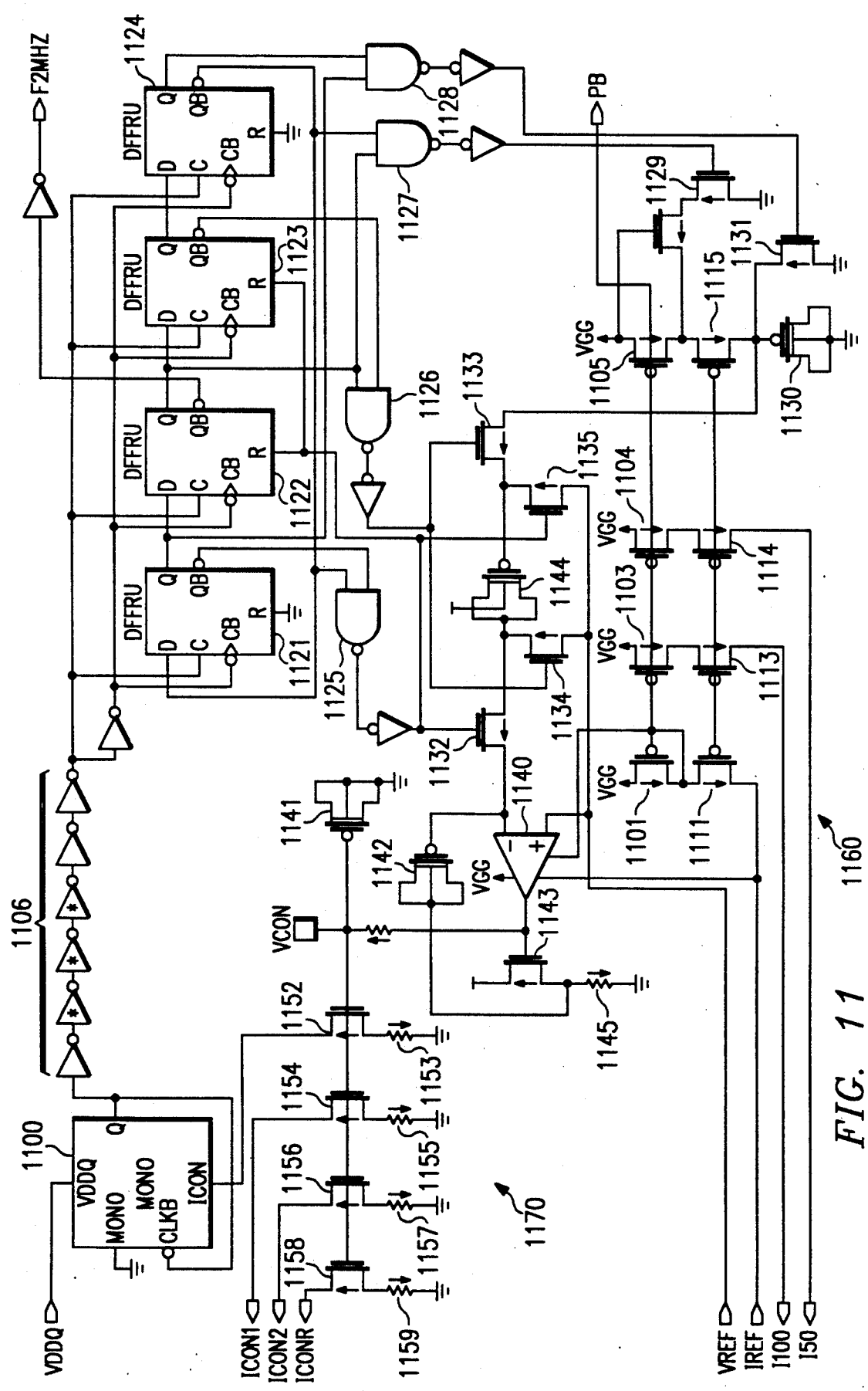

FIGS. 10-11 are schematic circuit diagrams of the pulse duration circuitry and which includes bandgap voltage reference 1000, voltage to current converter using differential amplifier 1020 and trimmable resistor array 1030, oscillator 1100, current mirrors 1101/1111, 1102/1112, 1103/1113, 1104/1114, 1105/1115, counter 1120, operational amplifier 1140, forming time-to-voltage converter 1160 and voltage-to-current converter 1170. This circuitry essentially (1) generates a stable, temperature independent reference voltage and reference current with bandgap reference 1000, differential amplifier 1020, and resistor array 1030, (2) uses monostable circuit 1100 p as a master oscillator to produce pulses which are matched by monostables 624 and 626, and (3) stabilizes the duration (frequency) of pulses of monostable 1100 by having the pulses drive counter 1120 which directs the reference current to charge capacitor 1130 for a time-to-voltage conversion and then compares the capacitor voltage to the reference voltage with operational amplifier 1140; if the comparison shows that the pulses are either too long or too short, then the timing current of each of the monostable circuits 624, 626, and 1100 is adjusted. In effect, monostable circuits 624 and 626 in FIGS. 6a-b are slaved to monostable circuit 1100 which has a feedback adjustment of its pulse duration by comparison to the reference voltage and reference current, and this provides a stable pulse generator without the use of a crystal oscillator or clock synchronization.

Bandgap reference 1000 generates a temperature compensated reference voltage by the usual balancing of the negative temperature coefficient of the emitter-base voltage of a bipolar transistor with the positive temperature coefficient of difference between the emitter-base voltages of two bipolar transistors operating at different current densities. This positive temperature voltage appears across resistor 1007. In particular, diode connected p-channel FET 1001 plus p-channel FET 1011 and p-channel FET 1002 plus diode connected p-channel FET 1012 form a Wilson current mirror and the current through FETs 1002 and 1012 is mirrored by p-channel FETs 1001/1011 and 1003/1013 but with the gate width of FET 1002 only one quarter that of FETs 1001 and 1003 and the gate width of FET 1012 one quarter of that of FETs 1011 and 1013, so the current through FETs 1001/1011 and 1003/1013 is four times that through FETs 1002/1012. These currents also pass through diode connected pnp bipolar transistors 1004, 1005, and 1006 with the area of the emitter-base junction of pnp 1005 sixteen times that of pnps 1004 and 1006, thus the emitter-base voltage drop of pnp 1005 is smaller by $(kT/q)\log 64$ (which is approximately 100 mV) due to the larger area and smaller current. This differential voltage drop linearly depends on temperature if the ratio of the currents can be held close to temperature independent. The emitter to base drop in pnp 1004 is about 100 mV higher than the drop in pnp 1005; so with a current of about 10 ua from FET 1002/1012 (and thus 40 ua from FETs 1001/1011 and 1003/1013) and a 10 K$\Omega$ resistor 1007, the drop across resistor 1007 would also be 100 mV and the source to gate voltages of n-channel FETs 1008 and 1009 would be equal. FET 1008 has four times the gate width of FET 1009 to handle the four times greater current. FETs 1008 and 1009 provide feedback that forces the voltage across pnp 1004 to equal the voltage across lower-current pnp 1005 plus the voltage across resistor 1007. At room temperature this can occur at two different current levels: zero current or currents of about 40 ua in pnp 1004 and 10 ua in pnp 1005 and resistor 1007. The startup circuit 1040-1042 prevents the zero current case.

The thus controlled current is mirrored by FETs 1003/1013 and passes through 7.5 K$\Omega$ resistor 1016 and 15.4 K$\Omega$ resistor 1017 and pnp 1006. The voltage at node 1019 (about 1.3 volts) is the temperature independent reference voltage and is amplified by amplifier 1021 to output the reference 2.02 volts at node VREF. The voltage at node 1018 (about 1.6 volts) has a positive temperature coefficient to compensate for the positive temperature coefficient of resistor 1022 so the quiescent source to gate voltage of n-channel FET 1024 will be temperature independent. The other input n-channel FET 1025 of differential amplifier 1020 then compares the voltage at node 1026 to that of node 1018 and outputs a gate voltage on n-channel FET 1028 to adjust its conductivity. P-channel FETs 1101/1111 are diode connected and use FET 1028 plus resistors in array 1030 as the current determining load; thus modulation of the conductivity of FET 1028 will adjust the current through FETs 1101/1111 and thereby have the current track the reference voltage and thus provide a current reference. Of course, the current level may be predetermined by blowing fuses in resistor array 1030 to set the resistance between node 1026 and ground while the reference voltage and differential amplifier will hold the voltage at node 1026 fixed except for temperature compensation due to the temperature coefficient of the resistors in resistor array 1030.

The reference current at node IREF from diode-connected FETs 1101/1111 is mirrored by p-channel FET pairs 1103/1113, 1104/1114, and 1105/1115. The mirror currents from FETs 1103/1113 and 1104/1114 are used elsewhere in the module 100 and exit at nodes 150 and 1100. The mirror current from FETs 1105/1115 is used to charge up time-to-voltage converter capacitor 1130 as part of the feedback stabilization of the pulse duration of monostable circuits 624 and 626; a description of the stabilization follows.

The tying of the MONO input to ground plus the feedback from the Q output to the CLKB input of monostable circuit 1100 connects it to oscillate (see FIG. 7) because FET 727 is always turned on and thus a low at CLKB will turn on FET 726 to set inverter 722 low (which will also make Q and CLKB high) and start the timing cycle by charging capacitor 732 as illustrated in the timing diagram FIG. 8. At the end of the capacitor 732 charging, inverter 722 switches high and thus Q and CLKB go low to start another cycle.

After a delay and pulse shaping by asymmetrical inverter chain 1106, the output of monostable 1100 clocks counter 1120 made of flip-flops 1121-1124 with the Q output of each flip-flop feeding the data input of the next flip-flop except that the NotQ (QB) output of the last flip-flop 1124 feeds back to the data input of the first flip-flop 1121. Thus the state of counter 1120 will repeat every eight clockings; however, if flip-flops 1121 and 1124 are both in the Q=0 state, then NAND gate 1125 plus adjacent inverter will generate a reset for flip-flops 1122-1123. This reset will occur within the first eight clockings whatever the initial state of counter 1120. Thus counter 1120 clocks through the following states:

| State | Flip-flop 1121 | Flip-flop 1122 | Flip-flop 1123 | Flip-flop 1124 |
|---|---|---|---|---|
| 0 | 0 | 0 | 0 | 0 |
| 1 | 1 | 0 | 0 | 0 |
| 2 | 1 | 1 | 0 | 0 |
| 3 | 1 | 1 | 1 | 0 |
| 4 | 1 | 1 | 1 | 1 |
| 5 | 0 | 1 | 1 | 1 |
| 6 | 0 | 0 | 1 | 1 |
| 7 | 0 | 0 | 0 | 1 |

NAND gates 1125-1128 plus adjacent inverters define signals TM0-TM3 depending upon the state of counter 1120. In particular, the signals TM0-TM3 are all low except TM0 is high during state 0, TM1 is high during state 2, TM2 is high during states 2 and 3, and TM3 is high during state 4. The signals TM0—TM3 control the stabilization of the pulse duration of monostable 1100 using the voltage and current references plus feedback by operational amplifier 1140 as follows:

First with counter 1120 in state 4, TM3 is high and this turns on n-channel FET 1131 to discharge capacitor 1130. Because TM0-TM2 are all low, n-channel FETs 1132-1135 are all off and the + input to operational amplifier 1140 is the voltage reference at VREF and the −input is the potential of capacitor 1142. Next, with counter 1120 switching into state 5, TM3 goes low to turn off FET 1131 and the current mirrored by FETs 1105/1115 from the reference current at IREF begins charging up capacitor 1130. This capacitor charging continues during counter states 6, 7, 0, and 1 during which time TM1 stays low to keep FET 1133 off and capacitor 1130 isolated from operational amplifier 1140, TM2 is low to keep n-channel FET 1129 off and avoid current diversion, and TM3 remains low to keep FET 1131 off and avoid capacitor discharge. That is, capacitor 1130 is charged by the reference current for five periods of monostable oscillator 1100. Also, during state 0, TM0 goes high and turns on FETs 1132 and 1135 which applies the voltage across sampling capacitor 1144 to the+and−inputs of operational amplifier 1140 which has implications: discussed below.

During state 2, TM1 and TM2 both are high. TM2 high turns on diversion FET 1129 and diverts the mirrored current from FET 1105 to ground, note that the gate width to length ratio of FETs 1129 and 1115 are both greater than that of FET 1105, and so FET 1115 is turned off. TM1 high turns on FETs 1133 and 1134 which connects the nongrounded plate of capacitor 1130 to one plate of sampling capacitor 1144 and connects the reference voltage at VREF to the other plate of sampling capacitor 1144. Thus sampling capacitor charges to a fraction of the difference between the reference voltage and the voltage on capacitor 1130 which is due to the reference current charging for five periods of monostable oscillator 1100; note that this presumes that both plates of capacitor 1144 are precharged (with respect to ground) to the voltage reference during state 0 (TM0 high) so that the charge redistribution between capacitors 1130 and 1144 is zero if the nongrounded plate of capacitor 1130 is at the reference voltage. The voltage across capacitor 1144 is about 4/5 the difference between the voltage on the nongrounded plate of 1130 and the reference voltage because the capacitance of 1130 is about four times that of 1144.

Then during state 3 TM1 goes low to again isolate sampling capacitor 1144, but TM2 remains high to keep FET 1129 turned on and the current from FET 1105 diverted to ground; this insures no glitches from the current source 1105 affect the charge on sampling capacitor 1144. Now during states 4-7 sampling capacitor 1144 remains isolated even though capacitor 1130 is again being charged up with the reference current from FETs 1105/1115.

Next, during state 0 TM0 goes high to turn on FETs 1132 and 1135 and thereby connect sampling capacitor 1144 across the inputs of operational amplifier 1140 together with the reference voltage applied to the+input and capacitor 1142 connected to the−input. Capacitor 1142 is charged so that the adjacent plate is at approximately the reference voltage. Thus if the voltage across sampling capacitor 1144 is zero, the differential input to operational amplifier 1140 is also zero and nothing changes. Note that the output of operational amplifier 1140 connects through a resistor to capacitor 1141 which is charged to hold n-channel FETs 1152, 1154, 1156, and 1158 turned on (in the linear region) to provide variable resistances together with resistors 1153, 1155, 1157, and 1159 which are used to set the currents from the diode-connected FETs 702 of each of the monostable circuits 624, 626, and 1100; see FIG. 7. That is, varying the charge on capacitor 1141 will adjust the current I from each FET 702, and this current sets the pulse duration as previously described. Capacitor 1141 also keeps n-channel FET 1143 turned on (in the linear region) to draw current through resistor 1145 and apply a bias to the remote plate of capacitor 1142.

However, if the voltage V across sampling capacitor 1144 is positive in the sense that the voltage across capacitor 1130 was greater than the reference voltage, then connecting sampling capacitor 1144 to the inputs of operational amplifier 1140 will yield a net voltage of about V/6 across the inputs of comparator because capacitor 1142 has about five times the capacitance of sampling capacitor 1144. Operational amplifier 1140 thus outputs a high to node 1141 which increases the gate bias of FET 1143 and thus the current through resistor 1145 and lifts the potential of capacitor 1142 to increase the −input of operational amplifier 1140 and turn it off. This transient high output by operational amplifier 1140 also slightly increases the charge on FET 1141 and thereby increases the current I in each monostable circuits 624, 626, and 1100. This increased current I implies a shorter charge time for timing capacitors 732 in the monostable circuits and thus a shorter pulse duration. The shorter pulse duration implies the charging of capacitor 1130 is shortened and thus a smaller voltage will be applied to sampling capacitor 1144, and consequently the operational amplifier 1140 provides a stabilization against pulse duration drifting longer.

Conversely, if the voltage V across sampling capacitor 1144 is negative, then connecting sampling capacitor 1144 to the inputs of operational amplifier 1140 will yield a net negative input and thus a low output which decreases the current through FET 1143 and lowers the potential of capacitor 1142 to turn operational amplifier 1140 off. The transient low from operational amplifier 1140 will also slightly decrease the charge on capacitor 1141 and thereby decrease the current I in monostable circuits 624, 626, and 1100 which increases the pulse duration and thereby increases the charging of capacitor 1130 to decrease the negative voltage V. Hence the operational amplifier 1140 also stabilizes the pulse duration of the monostable circuits against drifting shorter. Note that whether V is positive or negative the amount of ripple to be filtered out in this feedback scheme is small and provides an advantage over alternative methods.

Inverter chain 1106 provides an asymmetrical delay to give the clock pulses a more even duty cycle.

Figure 12:
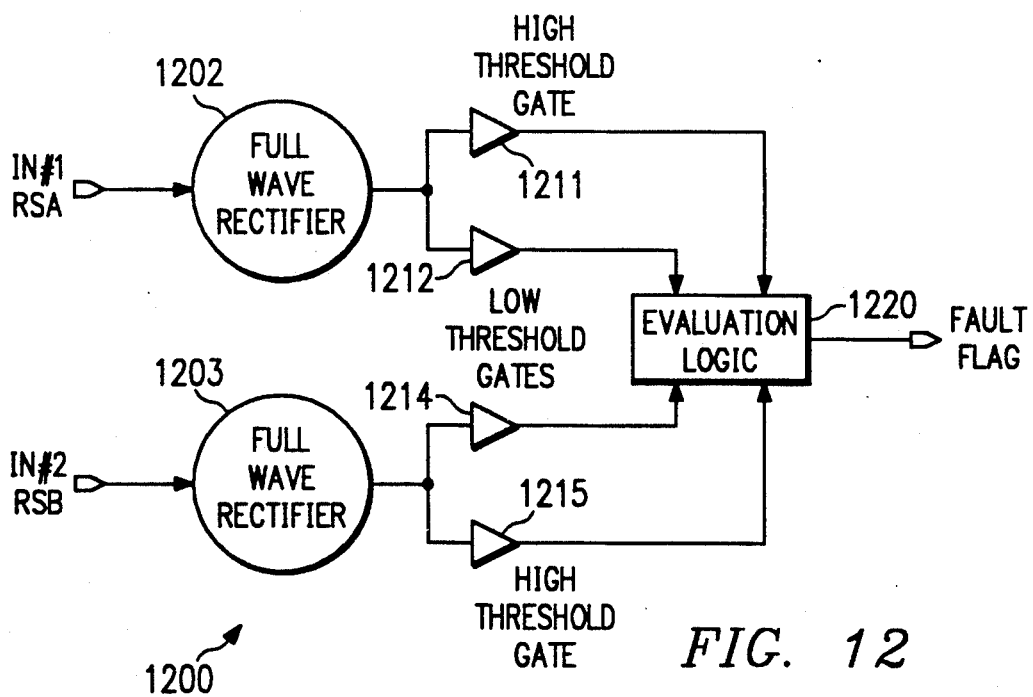
FIGS. 10–13 schematically show another portion of the circuitry of the embodiment of FIG. 1c.

FIG. 12 is a functional block diagram of detector 1200 for the RSA, RSB inputs of preferred embodiment 122. In particular, detector 1200 would be part of block RECEIVE INTEGRITY of FIG. 1c and would detect significant imbalances between the signals at the two inputs RSA and RSB. Recall that these signals should be balanced differential signals, so the presence of a signal on one input terminal and not on the other terminal is an indication of a continuity fault, but small differences in timing or signal strength between the two input terminals may occur under proper operating conditions and must be tolerated by detector 1200. Detector 1200 operates as follows.

The incoming RSA and RSB signals pass through full-wave rectifiers 1202-1203 to remove the polarity differences. Next, the rectified signals feed buffers 1211-1212 and 1214-1215 with the thresholds of buffers 1212 and 1214 both low (about 2 volts) and the thresholds of buffers 1211 and 1215 both high (about 3 volts). Evaluation logic 1220 compares the outputs of these buffers and flags a fault if one pair of buffers 1211-1212 or 1214-1215 has both buffers high and the other pair has both buffers low; that is, one rectified signal is higher than a high threshold and the other rectified signal is lower than a low threshold. Thus large imbalances of the signals will cause a fault flag, but small imbalances will not.

Figure 13:
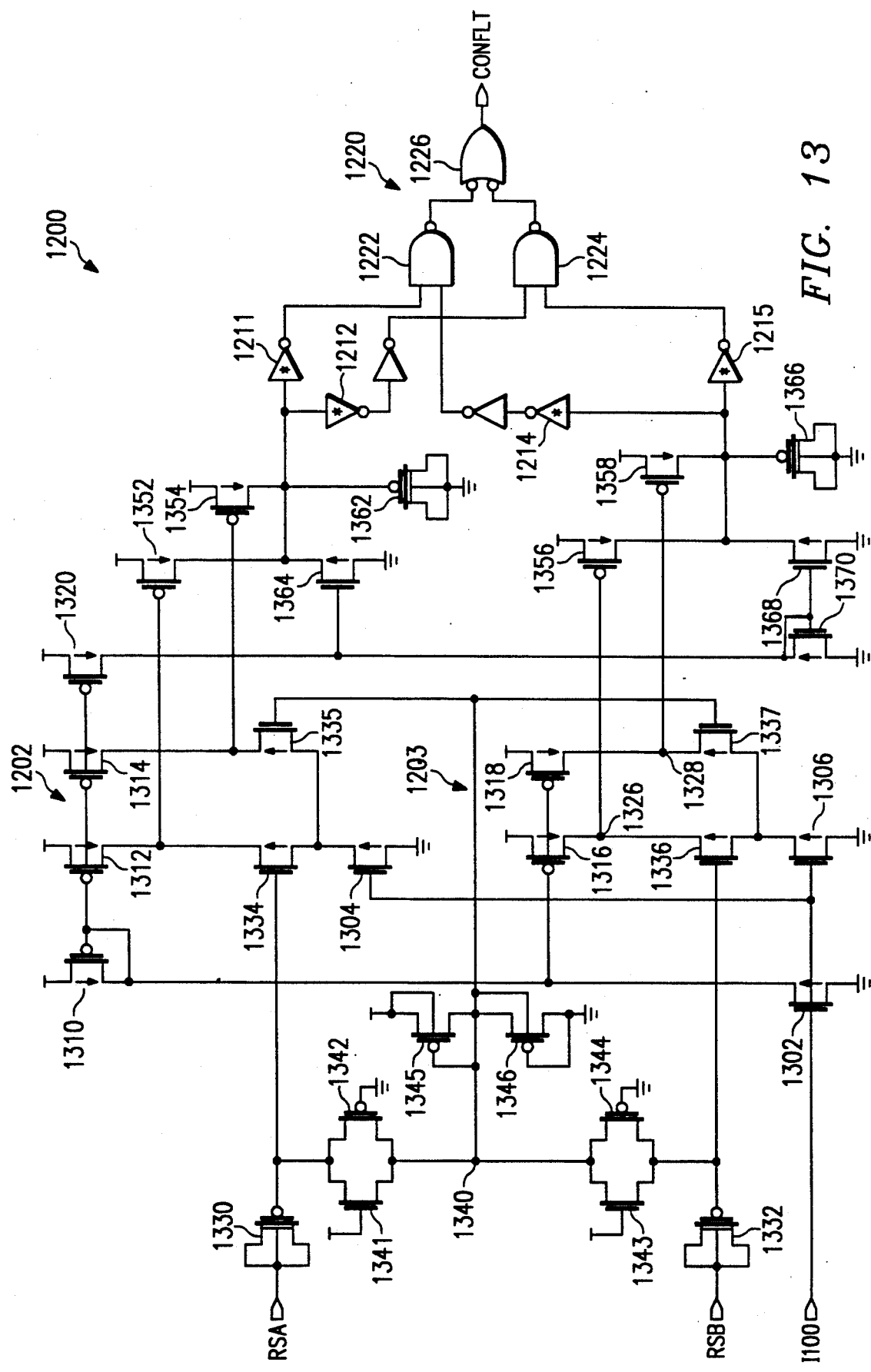

FIG. 13 schematically shows an embodiment of detector 1200. In particular, differential amplifiers 1202 and 1203 perform the rectification, inverters 1211 and 1215 are CMOS inverters which have an n-channel FET gate width to length ratio about one third that of the p-channel FET to set a high threshold voltage, inverters 1212 and 1214 are also CMOS inverters but with an n-channel FET gate width to length ratio about nine times that of the p-channel FET to set a low threshold voltage, evaluation logic 1220 includes NAND gates 1222 and 1224 and 1226. NAND gate 1222 low implies RSA is higher than the high threshold and RSB is lower than the low threshold and NAND gate 1224 low implies the converse, RSA lower than low and RSB higher than high. Thus NAND gate 1226 high indicates an imbalance in the RSA-RSB signal magnitudes.

In more detail, the potential at node 1100 biases n-channel FETs 1302, 1304, and 1306 so that the current through each of FETs 1304 and 1306 (the current sources for the differential amplifiers) is just double that through FET 1302. The current through FET 1302 biases diode-connected p-channel FET 1310 and this current is mirrored by p-channel FETs 1312, 1314, 1316, 1318, and 1320 with the FETs sized so that the current through each of the amplifier load FETs 1312, 1314, 1316, and 1318 is ⅔ the current through each of the amplifier current source FETs 1304 and 1306; that is, load FETs 1312, 1314, 1316, and 1318 easily overpower the current source FETs 1304 and 1306, so the load FETs stay out of saturation and the output nodes 1322, 1324, 1326, and 1328 potential is close to the power supply's. The input signals RSA and RSB pass through capacitors 1330 and 1332 to amplifier input n-channel FETs 1334 and 1336, and the common mode RSA plus RSB signal feed the other amplifier input n-channel FETs 1335 and 1337. The common mode node 1340 connects to the RSA-RSB nodes through high impedance turned on FETs 1341-1344, and node 1340 is diode connected to the power supply and to ground by FETs 1345-1346. Thus a large enough imbalance of the RSA-RSB signal magnitudes will unbalance the differential amplifiers and cause one of the output nodes 1322/1324 to go low enough to turn on one of p-channel FETs 1352 and 1354, similarly, one of output nodes 1326/1328 will also go low enough to turn on one of p-channel FETs 1356 and 1358. The current supplied by a turned on FET 1352/1354 charge capacitor 1362 and also feeds n-channel FET 1364 which is held on by the mirrored current from FET 1320 passing through n-channel FET 1370. Note that FET 1364 is continually bleeding charge off of capacitor 1362 which is averaging out the current from FETs 1352/1354 and which is the input to inverters 1211 (high threshold) and 1212 (low threshold). Similarly for FETs 1356/1358, capacitor 1366, and FET 1368. And these signal then are deciphered by the inverters 1211-1215 as described.

Module 100 may be fabricated with CMOS processing of silicon. The gate dimensions can be varied over a wide range, various CMOS processes such as metal, polysilicon or polycide gate, n-well, twin well, silicon-on-insulator, and so forth could be used. The embodiments could be adapted to manufacturing technologies such as bipolar, NMOS, PMOS, and BICMOS. Analogously, other semiconductor materials such as Ge, SiGe, GaAs, AlGaAs, GaInAsP, HgCdTe, HgZnMnTe, and so forth could be used although the available device types would differ.

FURTHER MODIFICATIONS AND VARIATIONS

The preferred embodiments may be modified in many ways while retaining one or more of the features of a system to regulate pulse width by width-error sensing and feedback control, and differential continuity detection. For example, the time-to-voltage conversion using the reference current to charge capacitor 1130 for a time determined by the pulse duration could be replaced by a frequency-to-voltage converter. Different methods (other than switches, amplifier, capacitor network 1132-1145) could be used for comparing the output of the time-sensing or frequency-sensing circuit to the reference voltage, such as an analog integrator or lossy integrator. Different methods could be used for generating pulses with durations controlled by a voltage or current. Different orders of integration could be used in the feedback control loop, and the separation of the pulse generators into master and slave units could be relaxed. The order of the counter-divider 1120 can be varied or even reduced to unity.

What is claimed is:

1. A doublet pulse generator, comprising:
   (a) first and second monostable circuits, said first and second monostable circuits made of matched components, each of said first and second monostable circuits with an input node and an output node, and with said output node of said first monostable circuit connected to said input node of said second monostable circuit;
   (b) first and second output devices, each of said output devices with first and second input nodes and an output node;
   (c) wherein said input node of said first monostable circuit couples to said first input node of said first output device, said output node of said first monostable circuit couples to said second input node of said first output device and to said first input node of said second output device, and said output node of said second monostable circuit couples to said second input node of said second output device;
   (d) whereby a signal at said input node of said first monostable circuit activates said first output device and said first monostable circuit, next after a time interval said first monostable circuit outputs a signal which deactivates said first output device and activates said second output device and said second monostable circuit, then after another of said time interval said second monostable circuit outputs a signal which deactivates said second output device.

2. The generator of claim 1, wherein:
   (a) said first and second output devices include set/reset flip-flops with said first input nodes of said first and second output devices being the set inputs of said flip-flops and said second input nodes of said first and second output devices being the reset inputs of said flip-flops.

3. The generator of claim 1, further comprising:
   (a) a third monostable circuit made of components matched to those of said first and second monostable circuits, said third monostable circuit connected as an oscillator;
   (b) a generator of a temperature-compensated reference voltage;
   (c) feedback control of the oscillator period of said third monostable circuit, said feedback control using said reference voltage to control said oscillator period; and
   (d) connections from said feedback control to said first and second monostable circuits to control the pulse duration of said first and second monostable circuits. c

* * * * *